(12) United States Patent
Stringer (10) Patent No.: US 7,541,807 B2
(45) Date of Patent: Jun. 2, 2009

(54) ROTOR DRIVE APPARATUS AND METHODS UTILIZING CENTER-FED RADIAL-OUTFLOW GAS

(75) Inventor: John Stringer, Longmont, CO (US)

(73) Assignee: Varian, Inc., Palo Alto, CA (US)

( * ) Notice: Subject to any disclaimer, the term of this patent is extended or adjusted under 35 U.S.C. 154(b) by 132 days.

(21) Appl. No.: 11/880,001

(22) Filed: Jul. 19, 2007

(65) Prior Publication Data

US 2009/0021260 A1 Jan. 22, 2009

(51) Int. Cl.
*G01V 3/00* (2006.01)
(52) U.S. Cl. .................................. 324/307; 324/309
(58) Field of Classification Search ......... 324/300–322; 415/200–203
See application file for complete search history.

(56) References Cited

U.S. PATENT DOCUMENTS

| | | | | |
|---|---|---|---|---|
| 4,201,941 A * | 5/1980 | Fyfe et al. | ............... | 324/321 |
| 4,254,373 A | 3/1981 | Lippman et al. | | |
| 4,275,350 A | 6/1981 | Hill et al. | | |
| 4,446,430 A * | 5/1984 | Stejskal | ............... | 324/321 |
| 4,456,882 A | 6/1984 | Doty | | |
| 4,511,841 A | 4/1985 | Bartuska et al. | | |
| 4,739,270 A | 4/1988 | Daugaard et al. | | |
| 4,899,111 A | 2/1990 | Pines et al. | | |
| 4,940,942 A | 7/1990 | Bartuska et al. | | |
| 5,202,633 A * | 4/1993 | Doty et al. | ............... | 324/321 |
| 5,289,130 A | 2/1994 | Doty | | |
| 5,298,864 A | 3/1994 | Müller et al. | | |
| 5,325,059 A | 6/1994 | Doty | | |
| 5,333,994 A | 8/1994 | Doty et al. | | |
| 5,508,615 A | 4/1996 | Doty et al. | | |
| 5,605,440 A * | 2/1997 | Bocoviz et al. | ............. | 415/200 |
| 6,320,384 B1 | 11/2001 | Doty et al. | | |
| 6,803,764 B2 | 10/2004 | Hioka | | |
| 7,170,292 B2 * | 1/2007 | Doty et al. | ................... | 324/321 |
| 7,250,767 B2 * | 7/2007 | Hofmann et al. | ............ | 324/321 |
| 2003/0102867 A1 * | 6/2003 | Hioka | ........................ | 324/321 |
| 2007/0189892 A1 * | 8/2007 | Oguma | ....................... | 415/200 |

OTHER PUBLICATIONS

F. D. Doty et al., Rev. Sci. Instrum., 52(12), "Design of High Speed Cylindrical NMR Sample Spinners," 1868-1875 (1981).

(Continued)

*Primary Examiner*—Brij B Shrivastav
(74) *Attorney, Agent, or Firm*—Bella Fishman; David P. Gloekler (57) ABSTRACT

A rotor drive apparatus includes a rotor and a stator. The stator has a gas injection orifice located on the axis about which the rotor spins. The gas injection orifice communicates with a bearing gap formed between a tapered surface of the rotor and an axially spaced tapered surface of the stator. A gas is flowed from the gas injection orifice through the bearing gap, thereby establishing a center-fed, radial-outflow gas bearing supporting the rotor during rotation. In one implementation, a separate flow of drive gas is fed to drive flutes of the rotor to drive rotation. In another implementation, the center-fed, radial-outflow gas flow is additionally utilized to impinge against the drive flutes to actuate the rotation.

25 Claims, 9 Drawing Sheets

OTHER PUBLICATIONS

F. D. Doty et al., Proceedings IECEC-91, "High Efficiency Microturbine Technology," 2, 436-442 (1991).

F. D. Doty, "Probe Design & Construction," The Encyclopedia of NMR vol. 6, Wiley, 3753-3762, (1996).

F. D. Doty, "Solid State Probe Design," The Encyclopedia of NMR vol. 7, Wiley, 4475-1185, (1996).

F. D. Doty et al., "Magnetism in High-Resolution NMR Probe Design. II: HR MAS", Concepts in Magnetic Resonance, vol. 10(4), 239-260 (1998).

* cited by examiner

ROTOR DRIVE APPARATUS AND METHODS UTILIZING CENTER-FED RADIAL-OUTFLOW GAS

FIELD OF THE INVENTION

The present invention relates generally to rotors of the type supported by gas bearings and/or driven by gas. In one specific example, the invention relates to sample spinners as utilized in nuclear magnetic resonance (NMR) techniques.

BACKGROUND OF THE INVENTION

Rotor assemblies generally include a stator and a rotor. Air, nitrogen or other gas may be utilized to drive the rotor to spin about an axis relative to the stator. Gas may also be utilized to create gas bearings that support the rotor axially and radially during spinning, reducing dynamic friction to almost negligible values. The gas bearings may also function to assist in stabilizing the position and motion of the rotor during spinning. Such a rotor typically has a cylindrical body elongated along the central spin axis. The stator is often coaxially positioned about the rotor such that an axially elongated annular gap exists between the outer boundary of the rotor and the inner boundary of the stator. Gas bearing orifices in the stator direct gas radially inward toward outer surface of the rotor to create a radial gas bearing in the annular gap and thereby assist in keeping the rotor centered about the spin axis during rotation and prevent contact with the stator. Gas bearing orifices may also direct gas radially inward toward one or both axial ends of the rotor to serve as axial thrust gas bearings. Turbine blades, cups or flutes may be formed at one or both axial ends of the rotor. Gas driving orifices may direct gas to impinge against these turbine elements to drive the rotation of the rotor about the spin axis.

Some rotor designs provide turbine drive functionality at both axial ends of the rotor. In some of these rotor designs, the rotor includes axial end caps with turbine blades or flutes circumferentially spaced around outer cylindrical walls of the end caps. Multiple gas jets direct gas radially inward toward the blades or flutes in the manner of an impeller. The rotor in some of these designs employs conical axial end caps instead of cylindrical end caps with the flutes being formed in the conical surfaces. The stator may include conical inside surfaces spaced from a conical axial end cap of the rotor, thereby providing a conical gap or cavity at the axial end to improve the stability of the rotation and maintain clearance between the rotor and the stator.

In other rotor designs, one axial end of the rotor serves as the turbine and the other axial end supports an axial thrust gas bearing or a radial (lateral or transverse) end gas bearing. The turbine end is typically cylindrical with circumferentially spaced blades or flutes. Alternatively, the turbine end of the rotor of this design may be conical with flutes or vanes with the stator having a conical surface forming a conical cavity with the rotor's turbine end. A conical turbine end may also function as an air bearing and, during spinning, may produce a Bernoulli effect that tends to pull the conical turbine end into the conical cavity. As an alternative to employing an axial thrust or radial end gas bearing at the opposing end of the rotor, the opposing end of the rotor may spin on a solid point bearing that extends from the stator (or outer housing or stationary structure) into contact with the axial center of this opposing rotor end.

Rotors as summarized above have been utilized in nuclear magnetic resonance (NMR) spectrometry. An NMR spectrometer typically includes radiofrequency (RF) transmitting/receiving electronics, a sample probe, and a source of a strong magnetic field in which the sample probe is immersed such as a superconducting magnet. The sample probe contains a liquid or solid sample and one or more RF coils that serve as the electromagnetic coupling between the RF electronics and the sample. The RF electronics are operated to irradiate the sample with RF energy and receive RF signals emitted from the sample in response to the RF input. The response signals are utilized to extract information regarding the sample. Stationary (non-spinning) sample probes are adequate for many types of liquid-phase samples, but usually do not produce sufficient resolution for solid-phase samples and certain types of liquid-phase samples such as inhomogeneous liquid samples. Accordingly, rotors have been utilized to contain and spin solid and liquid samples to improve resolution in NMR techniques. The spin rate may be on the order of $10^6$ revolutions per minute (RPM). In magic-angle spinning (MAS) techniques, the rotor is positioned to spin at the "magic angle" of 54.7° relative to the direction of the externally applied static magnetic field to further improve resolution.

Rotors employed in applications such as NMR must operate with a high level of precision and stability. Here, stability refers to restraining motion of the rotor along its axis of rotation as well as motion radial or transverse to the axis of rotation. For example, in the case of MAS Gradient systems, axial movement of the rotor on the order of $\frac{1}{10,000}^{th}$ to $\frac{1}{100,000}^{th}$ of an inch during gradient-refocused experiments will lead to artifacts in the detected NMR spectrum. Conventional rotor-stator systems generally do not provide the desired level of precision and stability for such NMR applications. Conventional rotor-stator systems require a multitude of drive jets impinging on the blades or flutes of a turbine to provide the rotational force needed to spin the rotor at the desired speeds. These types of rotor-stator systems impart at least two undesirable, destabilizing forces to the rotor. The first, an axial rotating net force, drives swirling and pivoting motions of the rotor that push the rotor off-axis. The second is a cogging force that occurs as each blade or flute passes over a drive jet. Cogging may also contribute to swirling and add pulsing accelerations to the rotor's motion that are also destabilizing. Destabilizing forces may be reduced or balanced by selecting certain ratios of number of drive jets to number of drive flutes, but an ideal ratio is often not practical given the spatial and geometric constraints of the typical rotor drive system.

Figure 1:
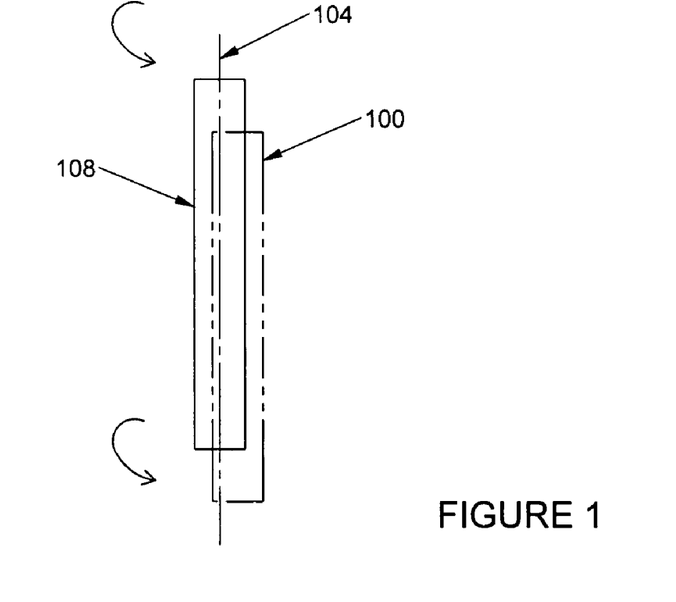
FIG. 1 is a schematic view of an ideal rotor and an actual rotor undergoing swirling and axial translation.

FIG. 1 schematically illustrates an ideal rotor 100. As it spins about its rotor axis 104, the ideal rotor 100 remains perfectly centered about the rotor axis 104 along the entire length of the ideal rotor 100. While it is being driven to spin, the ideal rotor 100 does not translate axially along the rotor axis 104, nor does it translate radially relative to the rotor axis 104. By comparison, an actual, conventional rotor 108 is also illustrated in FIG. 1. In response to being driven to spin about the intended rotor axis 104, the actual rotor 108 is observed to swirl relative to the rotor axis 104 according to a rotational motion generally indicated by arrows in FIG. 1. The actual rotor 108 is also axially translated relative to its intended position represented by the ideal rotor 100. It will be understood that the deviations of the actual rotor 108 from the ideal rotor 100 are exaggerated for illustrative purposes.

Figure 2:
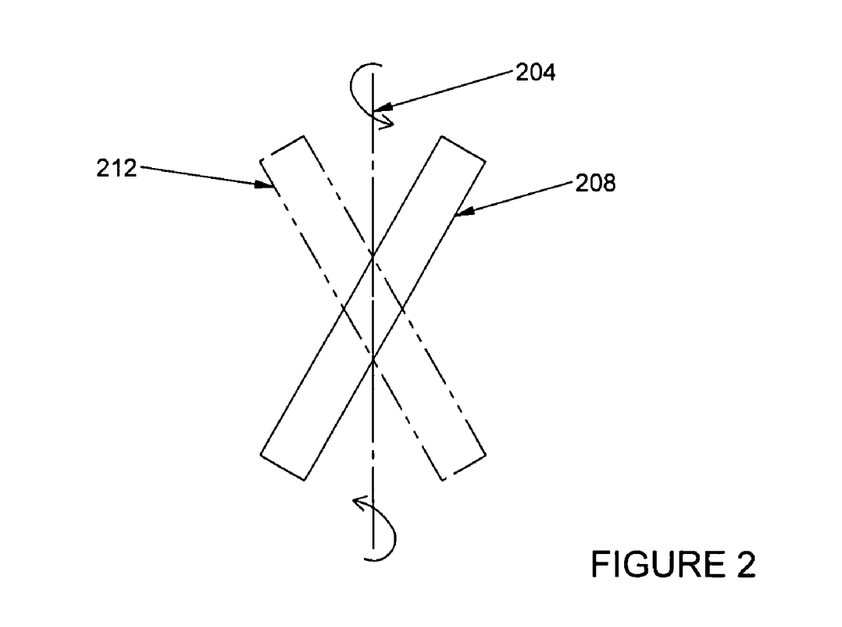
FIG. 2 is a schematic elevation view of an actual rotor undergoing pivoting motion.

FIG. 2 is a schematic elevation view of an actual rotor 208 pivoting, wobbling or precessing at an angle relative to an intended rotor axis 204 according to a pivoting motion generally indicated by arrows. The actual rotor 208 is also depicted at another point in time 212. These deviations are again exaggerated for illustrative purposes. During spinning, the same rotor 208 may undergo both the swirling motions depicted in FIG. 1 and the pivoting motions depicted in FIG. 2.

Accordingly, there is an acknowledged ongoing need for improvements in the technology of gas-driven rotors and associated systems and methods for driving and supporting rotors. In particular, there is a need for improving the stability of such rotors, and more particularly axial stability during driven rotation, including eliminating or at least substantially reducing the occurrence of destabilizing forces during the operation of such rotors.

SUMMARY OF THE INVENTION

To address the foregoing problems, in whole or in part, and/or other problems that may have been observed by persons skilled in the art, the present disclosure provides apparatus, devices, systems and/or methods relating to proportional valves, as described by way of example in implementations set forth below.

According to one implementation, a rotor drive apparatus includes a rotor and a stator. The rotor includes a rotor body disposed along an axis of rotation and a rotor end member disposed at an axial end of the rotor body. The rotor end member includes a rotor end surface and a plurality of drive flutes formed in the rotor end surface. The rotor end surface includes a tapered rotor surface terminating at a rotor tip disposed at the axis of rotation. The stator includes a stator body and a tapered stator surface. The tapered stator surface is axially spaced from the tapered rotor surface to form a bearing gap having a tapered profile coaxial with the axis of rotation. The stator further includes a gas passage formed through the stator body and terminating at an axial gas injection orifice. The axial gas injection orifice is disposed at the tapered stator surface and is coaxial with the axis of rotation. The rotor end member and the stator cooperatively form a gas path directed from the axial gas injection orifice and radially outward through the bearing gap at an angle to the axis of rotation.

According to another implementation, a rotor drive apparatus includes a rotor and a stator. The rotor includes a rotor body disposed along an axis of rotation and a rotor end member disposed at an axial end of the rotor body. The rotor end member includes a rotor end surface and a plurality of drive flutes formed in the rotor end surface. The rotor end surface includes a tapered rotor surface terminating at a rotor tip disposed at the axis of rotation. The stator includes a stator body and a tapered stator surface. The tapered stator surface is axially spaced from the tapered rotor surface to form a bearing gap having a tapered profile coaxial with the axis of rotation. The rotor drive apparatus further includes means for directing a gas from the axis of rotation and radially outward away from the axis of rotation through the bearing gap to create a gas bearing on which the rotor is supported during spinning.

According to another implementation, a method is provided for spinning a rotor about an axis of rotation along which the rotor is disposed. A gas is flowed from the axis of rotation and radially outward at an angle to the axis of rotation through a tapered bearing gap between a rotor end member of the rotor and a bearing surface of the stator. The rotor is spun, wherein the rotor end member spins on a gas bearing created in the bearing gap by the gas flowing through the bearing gap.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION OF THE INVENTION

In general, the term "communicate" (for example, a first component "communicates with" or "is in communication with" a second component) is used herein to indicate a structural, functional, mechanical, electrical, optical, magnetic, ionic or fluidic relationship between two or more components or elements. As such, the fact that one component is said to communicate with a second component is not intended to exclude the possibility that additional components may be present between, and/or operatively associated or engaged with, the first and second components.

The subject matter disclosed herein generally relates to systems, apparatus, devices, instruments, processes and methods related to gas-driven rotors such as for example may be utilized for spinning a material such as an NMR sample. Examples of implementations relating to the invention are described in more detail below with reference to FIGS. 3-10. These examples are provided in the context of NMR spectrometry, but it will be recognized that the broad aspects of the invention may be applicable to other types of technologies entailing the use of gas-driven rotors.

Figure 3:
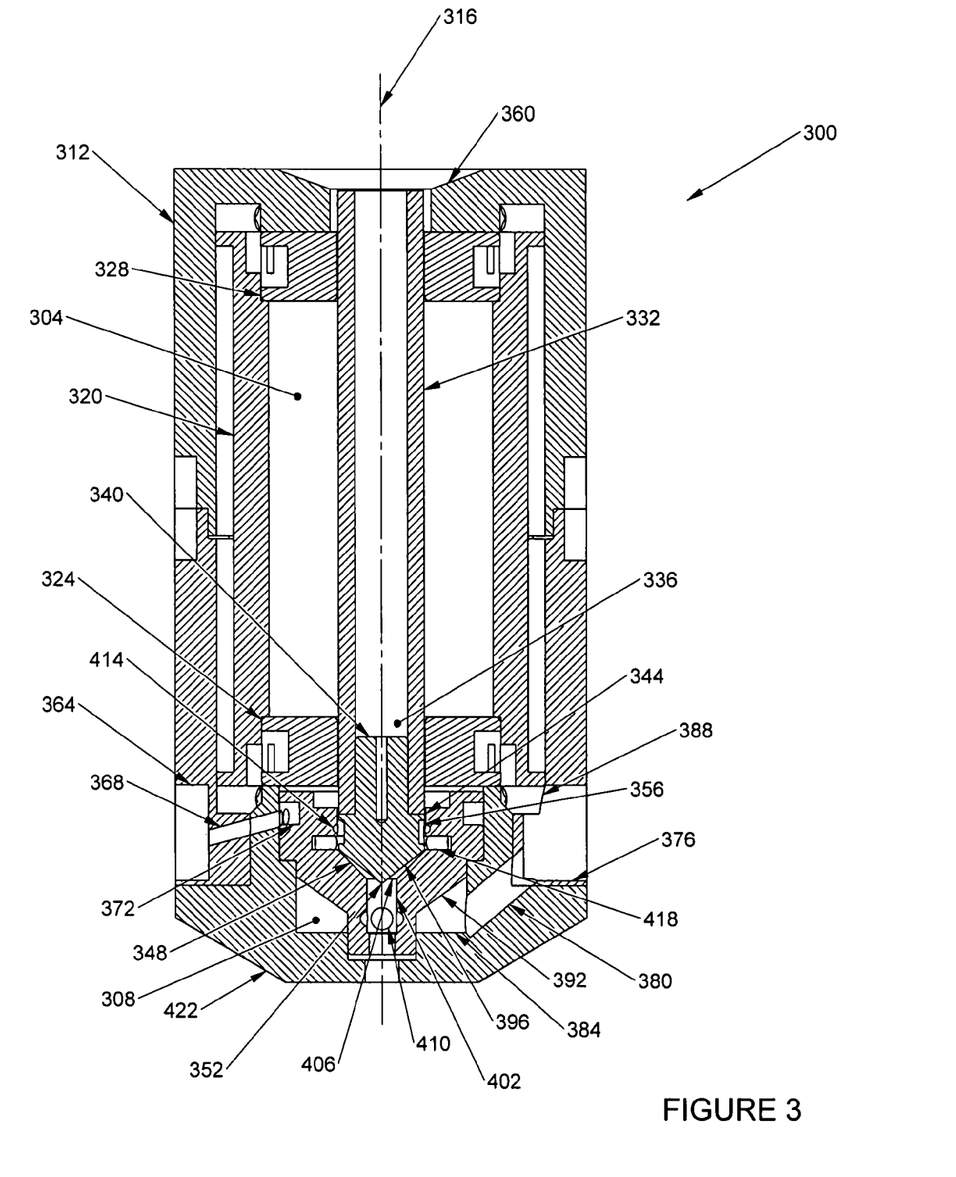
FIG. 3 is a cross-sectional elevation view of an example of a rotor drive apparatus according to an implementation of the invention.

FIG. 3 is a cross-sectional elevation view of a rotor assembly 300 such as may be utilized as a sample spinner in conjunction with magnetic resonance procedures. The rotor assembly 300 includes a rotor 304, a drive-end stator 308, and a housing 312 enclosing the rotor 304 and stator 308. The rotor 304 is driven to rotate about an axis of rotation (or rotational axis, or rotor axis) 316. The rotor assembly 300 may also include a cylindrical bearing sleeve 320 supporting one or more annular bearing members 324 and 328 radially between the rotor 304 and the bearing sleeve 320. The bearing members 324 and 328 provide lateral stabilization to the rotor 304 while the rotor 304 spins about the rotor axis 316. With the rotor 304 positioned at the operating position illustrated in FIG. 3, the rotor 304, bearing sleeve 320, and bearing members 324 and 328 are coaxial to the rotor axis 316.

The rotor 304 includes a rotor body or sleeve 332 having a length along the rotor axis 316. The rotor body 332 may be cylindrical. At least a portion of the rotor body 332 is hollow to receive a sample to be spun. The rotor 304 also includes a rotor end bearing/drive member 336. The rotor end member 336 includes a section 340 that may be dimensioned so as to be securely fitted into the cavity of the rotor body 332. The rotor end member 336 generally has an outer surface located outside the rotor body 332 (below the rotor body 332 from the perspective of FIG. 3). In the present example, the outer surface includes a lateral surface 344, which may be cylindrical and generally parallel to the rotor axis 316, and a tapered rotor surface 348 that is angled to the rotor axis 316. The tapered rotor surface 348 is "tapered" in the sense that its radius (orthogonal to the rotor axis 316) varies along the direction of the rotor axis 316 and eventually terminates at an apex or rotor tip 352 that lies on the rotor axis 316. The radius of the tapered rotor surface 348 varies from a maximum at the elevation where the tapered rotor surface 348 adjoins the lateral rotor surface 344 to a minimum corresponding to the apex 352. The tapered profile of the tapered rotor surface 348 may be conical (i.e., with straight lines making an angle to the rotor axis 316), as illustrated in FIG. 3, or alternatively may be curved. A number of drive flutes (or vanes, grooves, channels, recesses, etc.) 356 are formed in the outside surface of the rotor end member 336. In the present example, the drive flutes 356 are formed exclusively (entirely) in the lateral (or drive) surface 344 of the rotor end member 336. In another embodiment, the drive flutes 356 may partially be formed in the tapered rotor surface 348. The drive flutes 356 are shaped so as to react to the force of an impinging drive gas in a manner that causes the rotor 304 to rotate (spin) about the rotor axis 316 in a desired clockwise or counterclockwise direction. Ideally during spinning, the apex 352 remains positioned at the rotor axis 316 without deviation such as radial translation, axial translation, or precession relative to the rotor axis 316.

Figure 4:
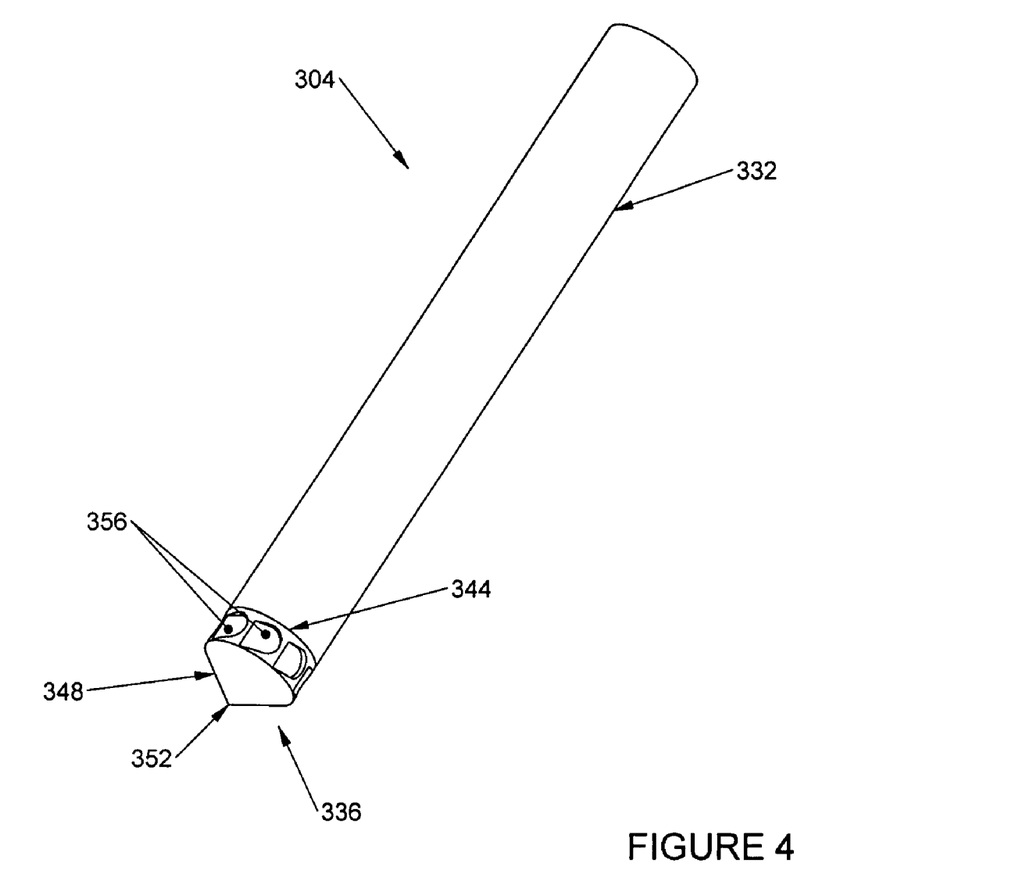
FIG. 4 is a perspective view of an example of a rotor that may be provided with the rotor drive apparatus illustrated in FIG. 3.

The housing 312 includes an access opening 360 through which the rotor 304 may be loaded into the rotor assembly 300 and subsequently removed. Referring also to FIG. 4, a perspective view of an example of the rotor 304, the outermost diameter of the rotor end member 336 does not exceed (or does not substantially exceed) the outermost diameter of the rotor body 332. This configuration facilitates the loading of the rotor 304 into and removal from the rotor assembly 300 between operations. The rotor 304 may be loaded or removed without having to disassemble the rotor assembly 300.

Referring back to FIG. 3, the housing 312 also includes a drive gas supply inlet 364 that receives a suitable drive gas (oxygen, nitrogen, air, etc.) from a suitable drive gas source (not shown). The drive gas supply inlet 364 communicates with one or more drive gas supply passages 368, whereby drive gas is supplied to an annular drive gas supply plenum or manifold 372 formed between the housing 312 and the stator 308. The housing 312 also includes a bearing gas supply inlet 376 that receives a suitable bearing gas (oxygen, nitrogen, air, etc.) from a suitable bearing gas source (not shown). The bearing gas supply inlet 376 communicates with one or more bearing gas supply passages 380, whereby bearing gas is supplied to an annular bearing gas supply plenum or manifold 384 formed between the housing 312 and the stator 308. The housing 312 may also include one or more passages, ducts, plenums, manifolds or the like 388 that communicate with the bearing gas supply inlet 376 for supplying bearing gas to the annular bearing members 324 and 328 or other elements of the rotor drive apparatus 300 utilized to generate lateral gas bearings. For instance, the bearing members 324 and 328 may include orifices (not shown) for directing gas into the annular gaps between the bearing members 324 and 328 and the rotor body 332.

The stator 308 is generally positioned at the rotor axis 316 axially below (from the perspective of FIG. 1) the rotor end member 336. The stator 308 includes a stator body 392 and a tapered stator surface 396 formed in the stator body 392. The tapered stator surface 396 is centered at the rotor axis 316; that is, the apex of the tapered stator surface 396 lies on the rotor axis 316. The apex of the tapered stator surface 396, however, is imaginary in the sense that an axial gas passage 402 is formed through the stator body 392 and terminates (opens) at a axial gas injection orifice (outlet) 406 disposed at the tapered stator surface 396 and centered on the rotor axis 316. That is, the axis of the axial gas injection orifice 406 is coincident (coaxial) with the rotor axis 316. A portion of the axial gas passage 402 leading to the axial gas injection orifice 406 may also be coincident with the rotor axis 316. The tapered stator surface 396 is axially spaced from the tapered rotor surface 348 so as to form an intermediary, annular bearing gap or cavity between the tapered stator surface 396 and the tapered rotor surface 348. As a result, the bearing gap itself is tapered and coaxial to the rotor axis 316.

The inlet of the bearing gap is generally defined at or near the apex 352 of the rotor end member 336, where the axial gas passage 402 adjoins the tapered stator surface 396 at the opening that serves as the axial gas injection orifice 406. The outlet of the bearing gap is generally defined at or near the boundary or edge where the tapered stator surface 396 adjoins the drive surface 344 of the rotor end member 336, where the drive flutes 356 are formed. Consequently, the bearing gap establishes a radial outflow path for bearing gas in directions angled to the rotor axis 316 and upward from the perspective of FIG. 3. In the illustrated example, the angle of the tapered rotor surface 348 relative to the rotor axis 316 differs from the angle of the tapered stator surface 396 relative to the rotor axis 316. In this manner, the cross-sectional area of the bearing gap narrows in the direction from the bearing gap inlet toward the bearing gap outlet. In other examples in which the profile of one or both of the tapered rotor surface 348 and the tapered stator surface 396 are curved, the minimum cross-sectional area of the bearing gap may occur at some point between the inlet and outlet of the bearing gap.

The bearing gas supply plenum 384 communicates with the axial gas passage 402 via one or more additional stator gas passages 410 (e.g., lateral, transverse, or radial passages). The stator 308 further includes a number of drive gas passages formed through the stator body 392 that run from the drive gas supply plenum 372 to corresponding drive gas injection orifices 414. The drive gas injection orifices 414 are disposed proximate to the drive flutes 356, on an internal surface of the stator body 392 defining the cavity in which the rotor end member 336 is located. The stator 308 further includes one or more exhaust gas vents, ports or passages 418. The inlets of the exhaust gas passages 418 may be located near the outlet of the bearing gap and the drive flutes 356.

As further illustrated in FIG. 3, a portion of the housing 312 may be provided in the form of an end cap structure 422. The end cap structure 422 has a central cavity in which the stator 308 is disposed. Several passages, plenums, ducts, vents and the like may be formed in the end cap structure 422 as needed for routing drive gas and bearing gas.

Figure 5:
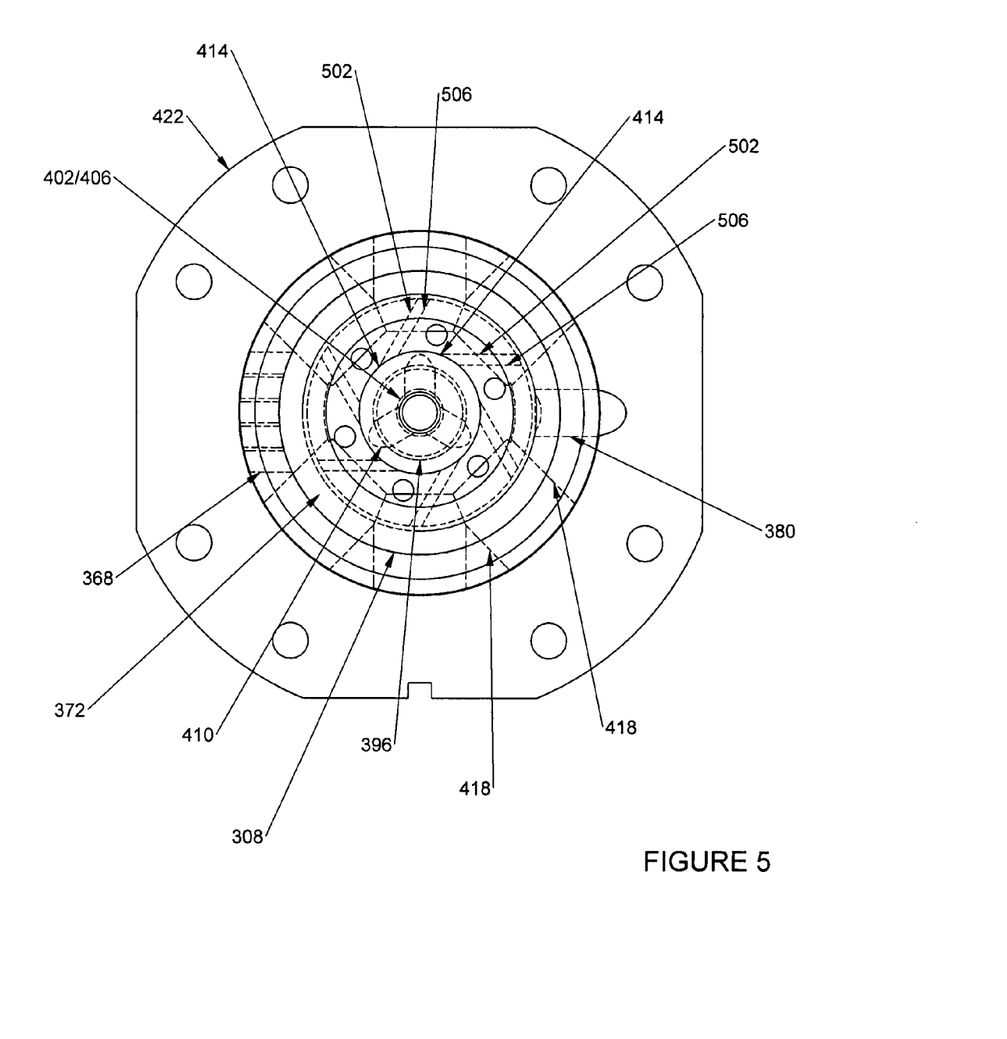
FIG. 5 is a top plan view of a drive-end section of the rotor drive apparatus illustrated in FIG. 3.

FIG. 5 is a top plan view (looking downward from the perspective of FIG. 3) of the end cap structure 422 with the stator 308 installed but without the rotor 304. At least a portion of the drive gas supply passage 368 (five drive gas supply passages 368 are provided in the illustrated example)

leading to the annular drive gas supply plenum 372 is formed through the end cap structure 422, as well as the bearing gas supply passage 380. The exhaust gas vents 418 (six are provided in the illustrated example) are formed through the stator 308 and continue radially outward through the end cap structure 422 as well as through a portion (not shown) of the housing 312 (FIG. 3) surrounding this section of the end cap structure 422. Also by way of example, three bearing gas passages 410 lead from the bearing gas supply plenum 384 (FIG. 3) to the central bearing gas passage 402 and axial bearing gas injection orifice 406. A number of drive gas injection passages 502 formed through the stator 308 lead from respective drive gas inlets 506 communicating with the drive gas supply plenum 372 to the respective drive gas injection orifices 414 that communicate with the central bore of the stator 308 where the rotor 304 is located. The drive gas injection passages 502 and corresponding drive gas injection orifices 414 are oriented at an angle relative to any radial line extending orthogonally from the rotor axis 316, such that drive gas injected into the central bore of the stator 308 impinges against the drive flutes 356 of the rotor end member 336 (FIG. 3) at an angle causing rotation of the rotor 304 in a counterclockwise direction (from the perspective of FIG. 5).

Figure 6:
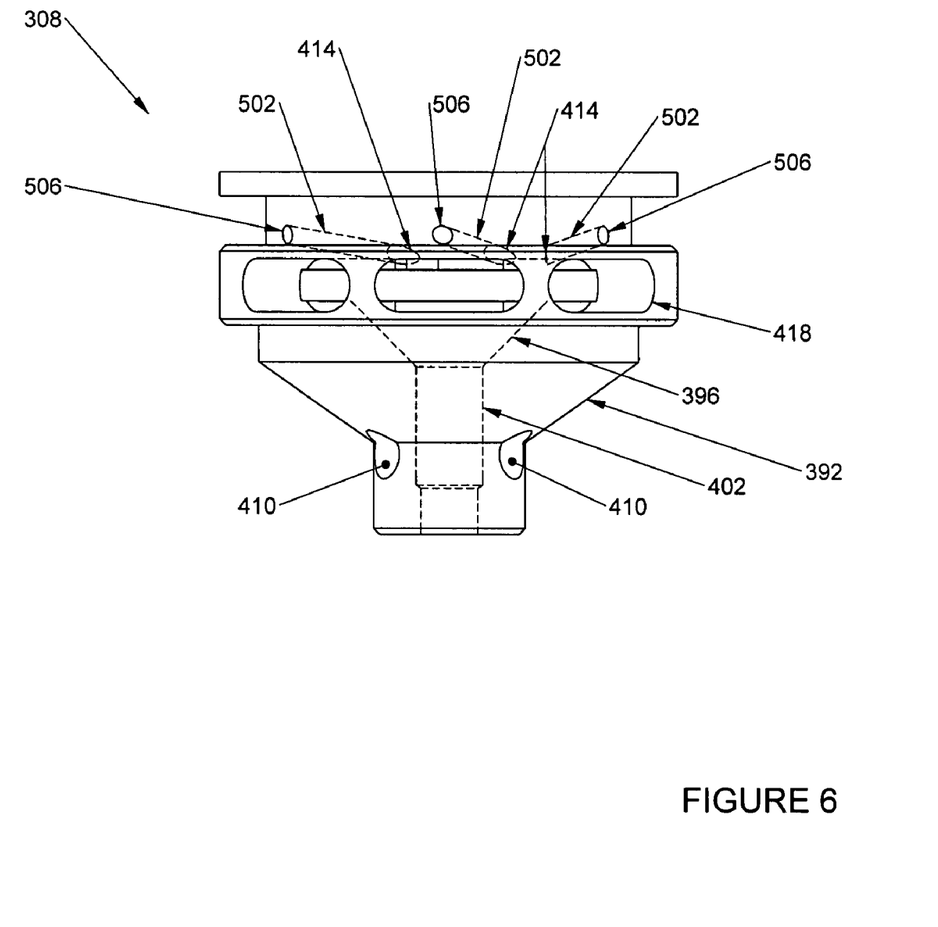
FIG. 6 is an elevation view of an example of a stator that may be provided with the rotor drive apparatus illustrated in FIG. 3.

FIG. 6 is an elevation view of the stator 308, again without the rotor 304 (FIGS. 3 and 4) installed. The drive gas injection passages 502 are oriented at an angle relative to any horizontal reference plane (from the perspective of FIG. 5). Moreover, these angles have downward orientations from the perspective of FIG. 5. That is, each drive gas injection passage 502 is angled downwardly from its drive gas inlet 506 to its drive gas injection orifice 414. Accordingly, drive gas is injected toward the drive flutes 356 in a downward direction. In operation, the downward flow of the drive gas into impingement with the drive flutes 356 not only drives the spinning motion of the rotor 304 but also forces the spinning rotor 304 downward into the bearing gap between the tapered stator surface 396 and the tapered rotor surface 348. This configuration improves the stability of the rotor 304 during spinning.

Figure 7:
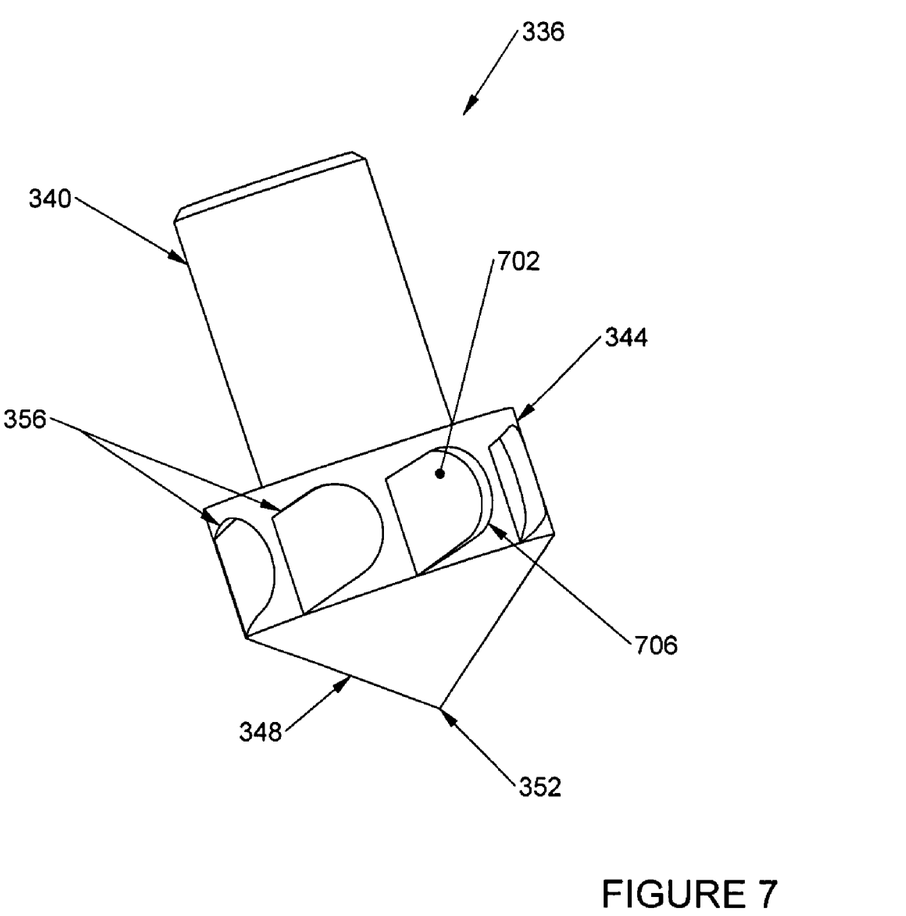
FIG. 7 is a perspective view of an example of a drive element that may be provided with the rotor illustrated in FIG. 4.

FIG. 7 is a perspective view of the rotor end member 336. In the illustrated example, each drive flute 356 is formed with a lateral surface 702 cut into the drive surface 344 of the rotor end member 336, resulting in an inside shoulder section 706 of varying dimensions between the lateral surface 702 and the drive surface 344. More generally, the drive flutes 356 may have any shape suitable for reacting to the downward, angled jets of drive gas in the manner described above.

Figure 8:
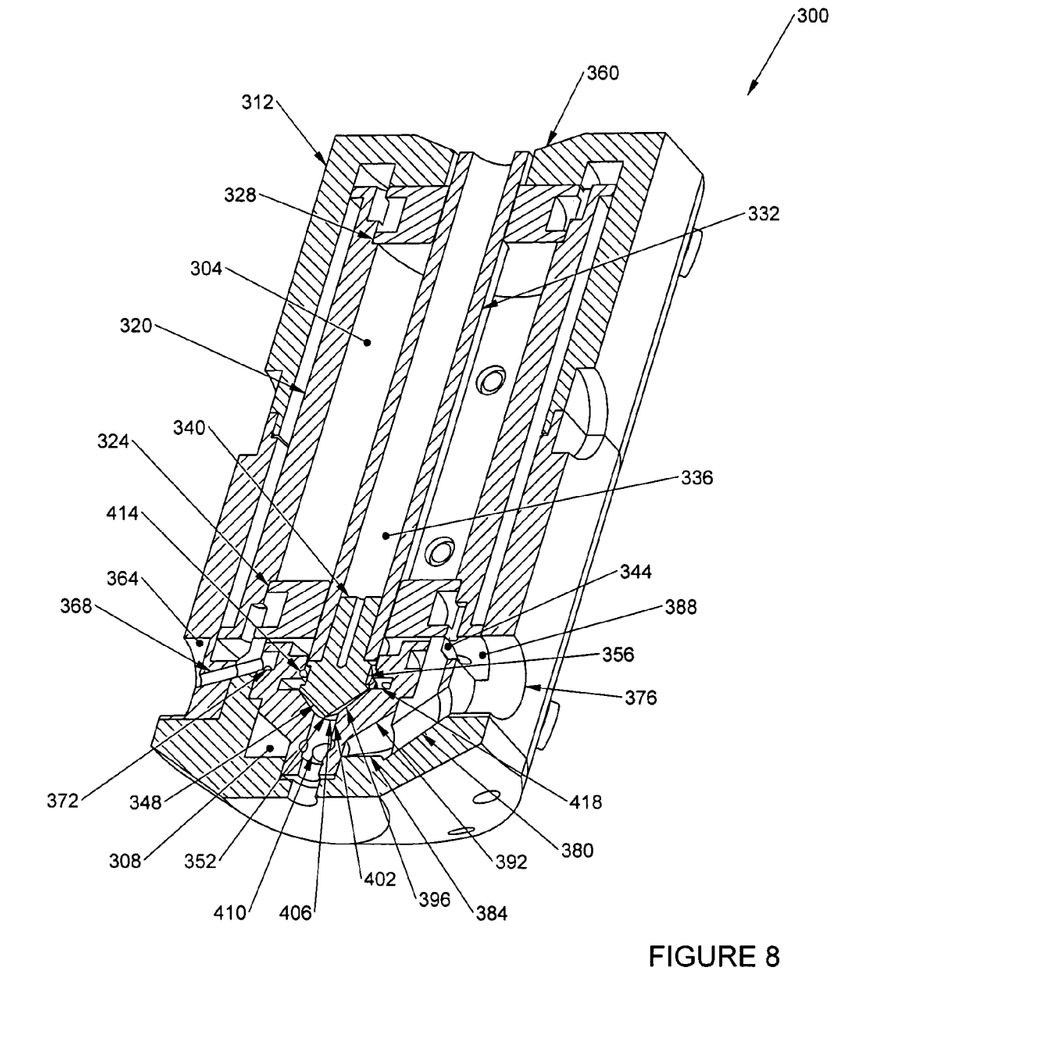
FIG. 8 is a cross-sectional perspective view of the rotor drive apparatus illustrated in FIG. 3.

FIG. 8 is a cross-sectional perspective view of the rotor assembly 300 illustrated in FIG. 3, with the same cross-sectional plane being employed. FIG. 8 is provided for further illustrative purposes.

Figure 9:
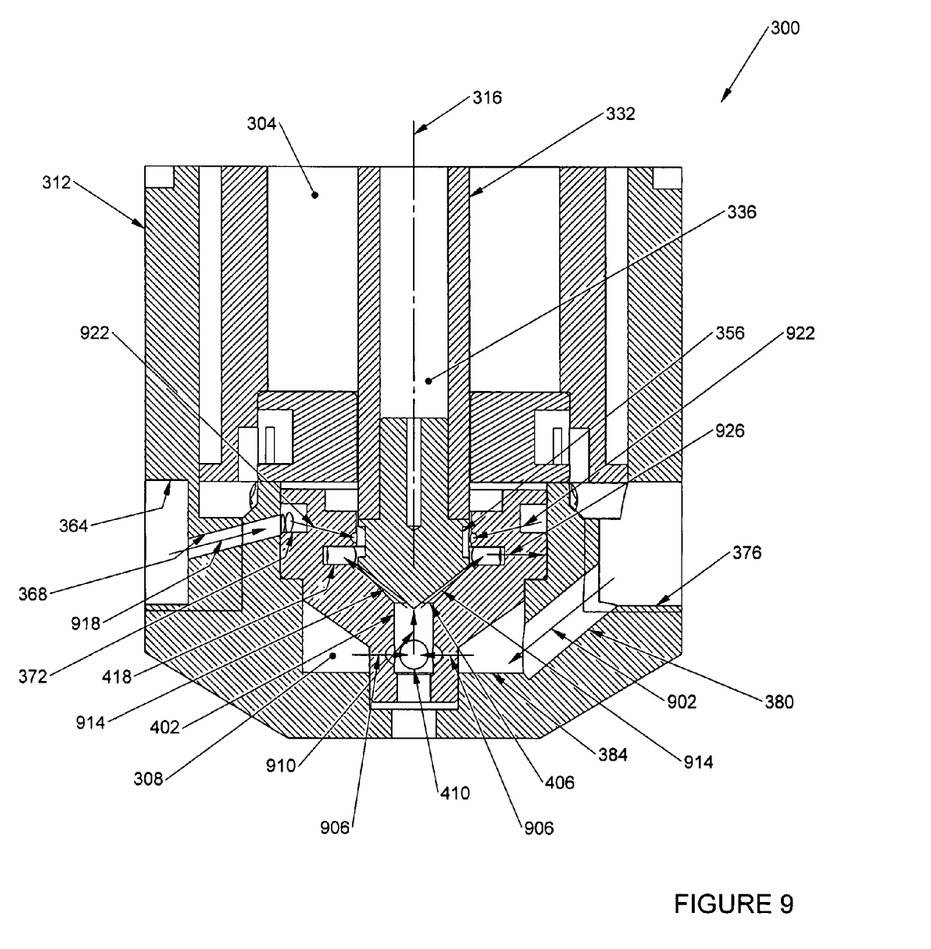
FIG. 9 is a cross-sectional elevation view of a lower section of the rotor drive apparatus illustrated in FIG. 3.

FIG. 9 is a cross-sectional elevation view of the lower section of the rotor assembly 300. The flow paths of drive gas and bearing gas established by the configuration of the rotor assembly 300 will now be described with reference to FIG. 9 in conjunction with the other Figures as may also be useful for a full understanding of the flow paths. The bearing gas is supplied from a bearing gas supply source (not shown) to the bearing gas supply inlet 376. The bearing gas flows from the bearing gas supply inlet 376 radially inwardly (and downwardly in the present example) through the bearing gas supply passage 380 and into the bearing gas supply plenum 384, as depicted by an arrow 902. The bearing gas then flows radially inwardly from the bearing gas supply plenum 384, through the bearing gas supply passages 410 and into the axial gas passage 402, as depicted by arrows 906. The bearing gas flows upwardly through the axial gas passage 402 generally along the rotor axis 316 and exits from the axial gas injection orifice 406 at the rotor axis 316, as depicted by an arrow 910 coincident with the rotor axis 316. From the axial gas injection orifice 406, the bearing gas flows radially outward and upward through the bearing gap defined between tapered rotor surface 348 and the tapered stator surface 396 (FIG. 3), as depicted by arrows 914.

The portion of the bearing gas path represented by the arrows 914 originates directly at the rotor axis 316 where the apex 352 (FIG. 3) of the tapered rotor surface 348 is located. Immediately upon encountering the apex 352, the bearing gas flows radially outward in all directions from the apex 352, thereby stabilizing the motion of the tapered rotor surface 348 and all other portions of the rotor 304. As the bearing gas flows through the bearing gap, the radius of the bearing gas flow path relative to the rotor axis 316 continues to increase until the bearing gas reaches the outermost periphery of the tapered rotor surface 348, at which point the bearing gas exits the bearing gap and flows into the exhaust gas ports 418. The bearing gas flowing through the bearing gap creates a center-fed, radial-outflow gas bearing that serves as an axial end or thrust bearing for the spinning rotor 304. Because the bearing gas flows from the rotor axis 316 along the entirety of the tapered rotor surface 348 from its apex 352 to its outermost diameter (which, in the present example, corresponds to the junction with the lateral rotor surface 344), the flow of bearing gas significantly improves the axial and rotational stability of the spinning rotor 304 in a manner not attained by techniques and configurations of the prior art.

It will also be noted that a high-pressure pulse of gas directed along the flow vector 910 could be utilized to facilitate removal of the rotor 304 out from the opening 360 of the housing 312 (FIG. 3).

Continuing with the example illustrated in FIG. 9, the drive gas is supplied from a drive gas supply source (not shown) to the drive gas supply inlet 364. The drive gas flows from the drive gas supply inlet 364, radially inwardly (and upwardly in the present example) through the drive gas supply passage(s) 368 and into the drive gas supply plenum 372, as depicted by an arrow 918. The drive gas then flows radially inwardly from the drive gas supply plenum 372, through the drive gas injection passages 502 (FIGS. 5 and 6) and into the central core of the stator 308 toward the drive flutes 356, as depicted by arrows 922. The drive gas then is deflected from the drive flutes 356 and flows into the exhaust gas vents 418. The combined radial outward flow of drive gas and bearing gas through the exhaust gas vents 418 is depicted by an arrow 926.

In the present example, the drive gas is injected into impingement with the drive flutes 356 at a downward angle. As previously indicated, this configuration enables the drive gas to bias the rotor 304 into the bearing gap against the upward force imparted by the radial outward and upward flow of the bearing gas, thereby contributing to improved stability of the spinning rotor 304. It should be additionally noted that features of the rotor drive apparatus 300 may be configured such that the bearing gas flowing through the bearing gap creates a gas bearing of the Bernoulli type, by which a pressure reduction in the bearing gap has the effect of pulling the rotor 304 into the bearing gap (but without causing the rotor 304 to contact the stator 308) until a balanced or equilibrium condition is reached at which the average fluid pressure exerted on the tapered rotor surface 348 equals the ambient (typically atmospheric or near-atmospheric) pressure exerted on the opposite end of the rotor 304.

Figure 10:
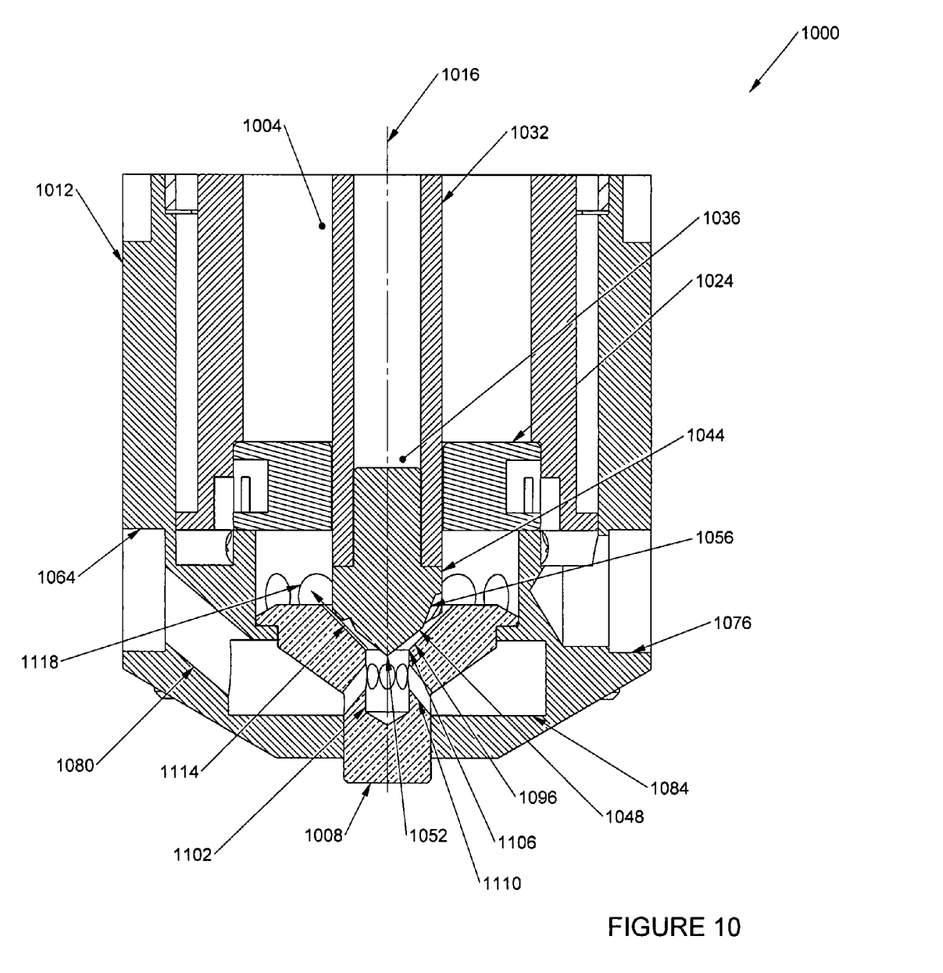
FIG. 10 is a cross-sectional elevation view of a lower section of a rotor drive apparatus according to another implementation of the invention.

FIG. 10 a cross-sectional elevation view of the lower section of a rotor assembly 1000 according to another implementation. Features or elements similar to those provided by the rotor assembly 300 described above and illustrated in FIGS. 3-9 are designated by similar reference numerals in FIG. 10. Like the rotor assembly 300, the rotor assembly 1000 illustrated in FIG. 10 provides a center-fed, radial-outflow gas bearing. The rotor assembly 1000 includes a rotor 1004, a stator 1008, and a housing 1012 enclosing the rotor 1004 and stator 1008. The rotor 1004 includes a rotor body 1032 elongated along the rotor axis 1016 about which the rotor 1004 spins, and a rotor end member or drive tip 1036 secured to the rotor body 1032. The outer surface of the rotor end member 1036 includes a lateral surface 1044 and a tapered rotor surface 1048 that tapers down to an apex 1052 located directly on the rotor axis 1016. Drive flutes 1056 are formed partially in the lateral surface 1044 and partially in the tapered rotor surface 1048. Alternatively, the drive flutes 1056 may be formed entirely in the tapered rotor surface 1048. A tapered bearing gap is defined between the tapered rotor surface 1048 and a tapered stator surface 1096 axially spaced below the tapered rotor surface 1048.

Unlike the earlier-described rotor assembly 300, the center-fed, radial-outflow gas provided by the rotor assembly 1000 illustrated in FIG. 10 is utilized not only to produce the earlier-described center-fed, radial-outflow gas bearing in the bearing gap but also as the drive gas. This implementation thus eliminates the need for individual, circumferentially-spaced drive gas jets. Bearing/drive gas is supplied from a suitable gas supply source (not shown) to a bearing/drive gas supply inlet 1064 and flows via a bearing/drive gas supply passage 1080 to a bearing/drive gas supply plenum 1084. The bearing/drive gas then flows from the bearing/drive gas supply plenum 1084 via one or more bearing/drive gas passages 1110 formed in the stator 1008 to an axial bearing/drive gas passage 1002, also formed in the stator 1008. The axial bearing/drive gas passage 1002 terminates at an axial bearing/drive gas injection orifice 1106 that is centered at the rotor axis 1016. The bearing/drive gas exits the axial bearing/drive gas injection orifice 1106 and flows radially outward and upward through the tapered bearing gap defined between the tapered rotor surface 1048 and tapered stator surface 1096, as depicted by an arrow 1114. The bearing/drive gas flowing through the tapered bearing gap in this implementation also impinges on the drive flutes 1056, thereby driving the spinning motion of the rotor 1004 about the rotor axis 1016. A separate flow of bearing gas may be established through a bearing gas supply inlet 1076 for supplying bearing gas to lateral gas bearings (e.g., bearing member 1024) that may be utilized to support the rotor body 1032.

The center-fed, radial-outflow gas bearing generated by the rotor assembly 1000 illustrated in FIG. 10 provides the same or similar advantages as those described earlier in connection with the rotor assembly 300, particularly the development of a Bernoulli-type gas bearing that serves to restrain the axial excursions of the rotor 1004 during driven rotation about the rotor axis 1016. Additionally, the implementation illustrated in FIG. 10 eliminates the use of a plurality of individual drive jets in favor of a single gas inlet (the illustrated bearing/drive gas injection orifice 1106) that supplies a contiguous radial outflow of drive gas to the drive flutes 1056. Because the source of drive gas is not segmented into individual drive jets, the cogging force typically associated with the use of a multitude of drive jets to drive a multitude of drive flutes 1056 may be eliminated.

Rotor-stator drive apparatus or systems such as the implementations described by way of example above have demonstrated significant improvement in minimizing axial motion of the rotor. Previously known systems, operating under highly optimized bearing gas pressures, drive gas pressures and spinning rates, have attained an upper limit of about 0.001 inch of axial motion of the rotor. While implementations taught by the present disclosure were still under investigation at the time of this disclosure, preliminary evaluations have indicated a reduction in the upper limit of axial motion of the rotor on the order of $1/10^{th}$ to $1/100^{th}$ of the previously attained limit, as observed using an optical comparator. That is, preliminary evaluations indicated axial motions not exceeding about 0.0001 inch to 0.00001 inch.

Rotor-stator drive apparatus or systems such as illustrated above may be implemented in any type of technique employing an NMR probe adapted for sample spinning. Examples include, but are not limited to, techniques relating to magic-angle spinning (MAS), double-orientation rotation (DOR), switched-angle spinning (SAS), variable-temperature (VT) applications, cryogenic applications, etc., and their variations.

The examples provided above implement a rotor-stator drive apparatus or system as a sample spinner in the context of NMR-related technology. It will be understood, however, that the inventions may find application to other technologies entailing the use of a rotor. Further examples include, but are not limited to, centrifuges, other types of tools and instruments that include spinning components such as drills or augers, other types of tools and instruments that include gas-driven turbines, turbine generators that include a magnetic rotor for producing electrical power, etc.

It will be further understood that various aspects or details of the invention may be changed without departing from the scope of the invention. Furthermore, the foregoing description is for the purpose of illustration only, and not for the purpose of limitation—the invention being defined by the claims.

What is claimed is:

1. A rotor drive apparatus for spinning of an NMR sample comprising:
   a rotor including a rotor body disposed along an axis of rotation and a rotor end member disposed at an axial end of the rotor body, the rotor end member comprising a rotor end surface and a plurality of drive vanes formed in the rotor end surface, the rotor end surface including a tapered rotor surface terminating at a rotor tip disposed at the axis of rotation; and
   a stator including a stator body and a tapered stator surface, the tapered stator surface axially spaced from the tapered rotor surface to form a bearing gap having a tapered profile coaxial with the axis of rotation, the stator further comprising a gas passage formed through the stator body and terminating at an axial gas injection orifice, the axial gas injection orifice disposed at the tapered stator surface and coaxial with the axis of rotation,
   wherein the rotor end member and the stator cooperatively form a gas path directed from the axial gas injection orifice and radially outward through the bearing gap at an angle to the axis of rotation.

2. The rotor drive apparatus of claim 1, wherein the tapered rotor surface is conical.

3. The rotor drive apparatus of claim 1, wherein the tapered rotor surface is curved.

4. The rotor drive apparatus of claim 1, wherein the rotor end surface further comprises a lateral rotor surface adjoining the tapered rotor surface, and the drive vanes are formed entirely in the lateral rotor surface.

5. The rotor drive apparatus of claim 1, wherein the rotor end surface further comprises a lateral rotor surface adjoining the tapered rotor surface, and the drive vanes are formed partially in the lateral rotor surface and partially in the tapered rotor surface.

6. The rotor drive apparatus of claim 1, wherein the rotor end surface further comprises a lateral rotor surface adjoining the tapered rotor surface, and the drive vanes are formed entirely in the tapered rotor surface.

7. The rotor drive apparatus of claim 1, wherein the stator body comprises a plurality of drive gas injection orifices proximate to the drive vanes.

8. The rotor drive apparatus of claim 7, wherein each drive gas injection orifice is oriented at an angle to the axis of rotation and generally downwardly toward the rotor tip.

9. The rotor drive apparatus of claim 7, wherein the stator body further comprises an exhaust gas passage communicating with the drive gas injection orifices and the bearing gap, the gas path directed from the axial gas injection orifice through the bearing gap is a bearing gas path that further is directed from the bearing gap radially outward toward the exhaust gas passage, and the rotor end member and the stator further cooperatively form a drive gas path directed from the drive gas injection orifices radially inward toward the drive vanes and from the drive vanes radially outward toward the exhaust gas passage.

10. The rotor drive apparatus of claim 7, further comprising a housing in which the stator is disposed, the housing including a drive gas supply plenum communicating with the drive gas injection orifices, and a bearing gas supply plenum communicating with the axial gas injection orifice via the gas passage.

11. The rotor drive apparatus of claim 1, wherein the stator body further comprises an exhaust gas passage communicating with the bearing gap.

12. The rotor drive apparatus of claim 1, further including a housing in which the stator is disposed, a lateral gas bearing member disposed adjacent to the rotor body, and a bearing gas supply plenum formed in the housing, the bearing gas supply plenum communicating with the axial gas injection orifice via the gas passage and with the lateral gas bearing member.

13. The rotor drive apparatus of claim 1, further including a housing in which the stator is disposed, the housing comprising a drive/axial bearing gas supply plenum communicating with the axial gas injection orifice via the gas passage, and a gas exhaust passage communicating with the bearing gap and the drive vanes, wherein the gas path directed from the axial gas injection orifice through the bearing gap is further directed from the bearing gap across the drive vanes and radially outward toward the exhaust gas passage.

14. The rotor drive apparatus of claim 13, further comprising a lateral gas bearing member disposed adjacent to the rotor body, wherein the housing further includes a lateral bearing gas supply plenum communicating with the lateral gas bearing member.

15. The rotor drive apparatus of claim 1, wherein the tapered portion of the rotor end surface and the tapered stator surface are shaped differently such that the bearing gap is reduced at a location distant from the axial gas injection orifice.

16. The rotor drive apparatus of claim 1, wherein the rotor body has an outermost diameter relative to the axis of rotation, and the rotor end member has an outermost diameter substantially equal to or less than the outermost diameter of the rotor body.

17. A rotor drive apparatus for spinning of an NMR sample comprising:
a rotor including a rotor body disposed along an axis of rotation and a rotor end member disposed at an axial end of the rotor body, the rotor end member comprising a rotor end surface and a plurality of drive grooves formed in the rotor end surface, the rotor end surface including a tapered rotor surface terminating at a rotor tip disposed at the axis of rotation;
a stator comprising a stator body and a tapered stator surface, the tapered stator surface axially spaced from the tapered rotor surface to form a bearing gap having a tapered profile coaxial with the axis of rotation; and
means for directing a gas from the axis of rotation and radially outward away from the axis of rotation through the bearing gap to create a gas bearing on which the rotor is supported during spinning.

18. The rotor drive apparatus of claim 17, wherein the gas directing means comprises a gas passage formed through the stator body, and an axial gas injection orifice at which the gas passage terminates, the axial gas injection orifice disposed at the tapered stator surface and coaxial with the axis of rotation.

19. The rotor drive apparatus of claim 17, further comprising means for pushing the rotor axially into the bearing gap during spinning.

20. The rotor drive apparatus of claim 19, wherein the pushing means comprises a plurality of drive gas injection orifices formed in the stator body and a drive surface of the rotor end surface, and the drive grooves are formed at least partially on the drive surface proximate to the drive gas injection orifices.

21. The rotor drive apparatus of claim 17, wherein the stator body further comprises a plurality of drive gas injection orifices, the rotor end surface further includes a drive surface, and the drive grooves are formed at least partially on the drive surface proximate to the drive gas injection orifices.

22. The rotor drive apparatus of claim 17, wherein the drive grooves are formed at least partially on the tapered rotor surface, and the gas directing means directs the gas from the bearing gap into impingement with the drive grooves to spin the rotor.

23. A method for spinning a rotor of an NMR sample spinning apparatus about an axis of rotation along which the rotor is disposed, the method comprising:
flowing a gas from the axis of rotation and radially outward at an angle to the axis of rotation through a tapered bearing gap between a rotor end member of the rotor and a bearing surface of the stator; and
spinning the rotor, wherein the rotor end member spins on a gas bearing created in the bearing gap by the gas flowing through the bearing gap.

24. The method of claim 23, wherein spinning the rotor comprises flowing a second gas into impingement with a plurality of drive grooves of the rotor end member, the second gas being separate from the gas flowed through the tapered bearing gap.

25. The method of claim 23, wherein spinning the rotor comprises flowing the gas from the tapered bearing gap and into impingement with a plurality of drive grooves of the rotor end member, the drive grooves being formed at least partially on a tapered rotor surface of the rotor end member, the tapered rotor surface at least partially defining the tapered bearing gap.

* * * * *